US012713752B2

(12) United States Patent
Tan et al.

(10) Patent No.: US 12,713,752 B2
(45) Date of Patent: Aug. 18, 2026

(54) MICRO LED STRUCTURE AND FULL COLOR MICRO LED PANEL INCLUDING SAME

(71) Applicant: Hue Inc., Shanghai (CN)

(72) Inventors: Wei Sin Tan, Shanghai (CN); Qunchao Xu, Shanghai (CN)

(73) Assignee: Hue Inc., Shanghai (CN)

( * ) Notice: Subject to any disclaimer, the term of this patent is extended or adjusted under 35 U.S.C. 154(b) by 378 days.

(21) Appl. No.: 18/542,755

(22) Filed: Dec. 17, 2023

(65) Prior Publication Data

US 2024/0213293 A1 Jun. 27, 2024

Related U.S. Application Data

(63) Continuation of application No. PCT/CN2022/141528, filed on Dec. 23, 2022.

(51) Int. Cl.

| | |
|---|---|
| ***H10H 29/10*** | (2025.01) |
| ***H10H 20/814*** | (2025.01) |
| ***H10H 20/821*** | (2025.01) |
| ***H10H 20/831*** | (2025.01) |
| ***H10H 20/832*** | (2025.01) |
| ***H10H 20/841*** | (2025.01) |
| ***H10H 20/85*** | (2025.01) |
| ***H10H 20/857*** | (2025.01) |
| ***H10H 29/14*** | (2025.01) |
| ***H10H 29/24*** | (2026.01) |
| ***H10H 29/80*** | (2025.01) |
| ***H10W 90/00*** | (2026.01) |

(52) U.S. Cl.
CPC ............ *H10H 29/10* (2025.01); *H10W 90/00* (2026.01)

(58) Field of Classification Search
CPC .. H10H 20/856; H10H 20/835; H10H 20/841; H10H 20/814; H10H 29/10; H10H 20/821; H10H 29/142; H10H 29/24; H10H 29/962; H10H 20/8312; H10H 20/8314
See application file for complete search history.

(56) References Cited

U.S. PATENT DOCUMENTS 10,020,639 B2 * 7/2018 Lell ........................ H01S 5/3013
10,170,666 B2 * 1/2019 Cha ...................... H10H 20/813
10,748,881 B2 * 8/2020 Kim .................. H10H 20/8131
(Continued)

FOREIGN PATENT DOCUMENTS

CN 110603639 A 12/2019
CN 110785841 A 2/2020
(Continued)

OTHER PUBLICATIONS

International Search Report and Written Opinion in counterpart PCT Application No. PCT/CN2022/141528, dated May 17, 2023.

*Primary Examiner* — Sonya McCall-Shepard
(74) *Attorney, Agent, or Firm* — FINNEGAN, HENDERSON, FARABOW, GARRETT & DUNNER LLP

(57) ABSTRACT

A full color micro LED structure is disclosed. The micro LED structure comprises an IC back plane, at least three mesa structures stacked along a vertical axis, and a top contact formed above the at least three mesa structures. The second mesa structure comprises two connecting layers, a reflection layer, and a light emitting layer. The third mesa structure comprises a bonding layer, a reflection layer, a light emitting layer, and a connecting layer.

24 Claims, 7 Drawing Sheets

(56) References Cited

U.S. PATENT DOCUMENTS

| | | | | |
|---|---|---|---|---|
| 2010/0032691 | A1 | 2/2010 | Kim | |
| 2022/0344313 | A1* | 10/2022 | Li | H10H 20/856 |

FOREIGN PATENT DOCUMENTS

| | | | | |
|---|---|---|---|---|
| CN | 112117356 | A | | 12/2020 |
| CN | 114766065 | A | | 7/2022 |
| CN | 114793476 | A | | 7/2022 |
| CN | 115064528 | A | | 9/2022 |
| EP | 1482566 | A2 | | 12/2004 |
| JP | 2005072323 | A | * | 3/2005 |
| TW | 200406814 | A | | 5/2004 |
| TW | 200409382 | A | | 6/2004 |
| TW | 202226633 | A | | 7/2022 |
| WO | 2021247887 | A1 | | 12/2021 |

* cited by examiner

MICRO LED STRUCTURE AND FULL COLOR MICRO LED PANEL INCLUDING SAME

CROSS-REFERENCE TO RELATED APPLICATION

This application claims the benefit of priority of International Application No. PCT/CN2022/141528, filed Dec. 23, 2022, titled "Micro LED Structure and Full Color Micro LED Panel," the entire disclosure of which is incorporated herein by reference.

FIELD OF THE DISCLOSURE

The present disclosure generally relates to micro light-emitting diode (LED) technology and, more particularly, to a micro LED structure and a full color micro LED panel using the micro LED structure.

BACKGROUND OF THE DISCLOSURE

Inorganic micro light-emitting diodes are also called "micro LEDs." They are increasingly important because of their use in various applications including, for example, self-emissive micro-displays, visible light communications, and opto-genetics. The micro LEDs have greater output performance than conventional LEDs, due to better strain relaxation, improved light extraction efficiency, uniform current spreading, etc. Moreover, compared with the conventional LEDs, the micro LEDs have improved thermal effects, improved operation at higher current density, better response rate, greater operating temperature range, higher resolution, higher color gamut, higher contrast, lower power consumption, etc.

A full color micro LED panel is manufactured by integrating an array of thousands or even millions of micro LEDs with a driver circuitry back panel. Each pixel of the micro LED panel is formed by one or more micro LEDs. The micro LED panel can be a mono-color or multi-color panel. In particular, for a full color LED panel, each pixel may further include multiple sub-pixels respectively formed by multiple micro LEDs, each of which corresponds to a different color. For example, three micro LEDs respectively corresponding to red, green, and blue colors may be superimposed to form one pixel. The different colors can be mixed to produce a broad array of colors.

The existing micro LED technology, however, faces several challenges. For example, one challenge is to improve the effective illumination area within each pixel when the distance between the adjacent LEDs is determined. Moreover, when a single LED illumination area is determined, further improving the overall resolution of the micro LED panel can be a difficult task because micro LEDs with different colors have to occupy their designated zones within the single pixel.

Additionally, the light emitted by the LED dies is generated from spontaneous emission and is thus not directional, resulting in a large divergence angle. The large divergence angle can cause various problems in a micro-LED panel. On one hand, due to the large divergence angle, only a small portion of the light emitted by the micro-LEDs can be utilized. This may significantly reduce the efficiency and brightness of a micro-LED display system. On the other hand, due to the large divergence angle, the light emitted by one micro-LED pixel may illuminate its adjacent pixels, resulting in light crosstalk between pixels, loss of sharpness, and loss of contrast.

Furthermore, conventional metal-to-metal bonding has relatively greater thickness and lower bonding strength. Greater thickness may distort the emitted light and bring challenges to further minimization of the LED panels. Therefore, it is desirable to further reduce the thickness of bonding layers and improve bonding strength.

BRIEF SUMMARY OF THE DISCLOSURE

The present disclosure provides a micro LED structure that addresses the problems in the related art, such as the problems described above. In particular, the disclosed micro LED structure integrates two or more vertically stacked micro LEDs, by placing them at different layers of the micro LED structure and electrically connecting them to an integrated circuit (IC) back panel. The micro LED structure effectively enhances the light illumination efficiency within a single pixel area, and at the same time, improves the resolution of the micro LED panel.

Moreover, the disclosed micro LED structure further improves the light illumination efficiency by including reflection layers that not only effectively increase the amount of light emitted by each of the vertically stacked micro LEDs, but also reduce crosstalk between the vertically stacked micro LEDs.

Consistent with the disclosed embodiments, a $SiO_2$—$SiO_2$ or ITO-ITO bonding is used instead of metal-metal bonding. The $SiO_2$—$SiO_2$ or ITO-ITO bonding may further reduce the thickness of the bonding layers while achieving a higher bond strength. According to some embodiments, the ITO-ITO bonding may eliminate the needs of an ITO-connecting layer (ITO-C).

Consistent with the disclosed embodiments, a plurality of the disclosed micro LED structures can be arranged in a micro LED array to form a micro LED panel. Each of the plurality of micro LED structures corresponds to a pixel of the disclosed micro LED structure, and the multiple vertically stacked micro LEDs in a pixel correspond to multiple sub-pixels respectively.

In some embodiments, the disclosed micro LED structure comprises an IC back plane, at least three mesa structures stacked along a vertical axis, and a top contact formed above the at least three mesa structures.

In some embodiments, the at least three mesa structures comprises a first mesa structure formed on the IC back plane, a second mesa structure formed on the first mesa structure, and a third mesa structure formed on the second mesa structure.

In some embodiments, the second mesa structure comprises a first connecting layer, a first reflection layer formed on the first connecting layer, a first light emitting layer formed on the first reflection layer, the first light emitting layer comprising a first semiconductor layer and a second semiconductor layer formed on the first semiconductor layer, and a second connecting layer formed on the first light emitting layer.

In some embodiments, the third mesa structure comprises a first bonding layer formed on the second connecting layer, a second reflection layer formed on the first bonding layer, a second light emitting layer formed on the second reflection layer, the second light emitting layer comprising a third semiconductor layer and a fourth semiconductor layer formed on the third semiconductor layer, and a third connecting layer formed on the second light emitting layer.

In some embodiments, the first connecting layer and the third connecting layer are electrically connected with the IC back plane.

In some embodiments, the second connecting layer is connected with the top contact.

In some embodiments, the first and fourth semiconductor layers have a first conductive type, and the second and third semiconductor layers have a second conductive type.

In some embodiments, each of the light emitting layers comprises a P-type semiconductor layer, an N-type semiconductor layer, and a quantum well layer between the P-type semiconductor layer and the N-type semiconductor layer. For example, each of the light emitting layers may comprise a P-type semiconductor layer at the bottom and an N-type semiconductor layer on the top, thereby forming a P-N junction; or alternatively, each of the light emitting layers may comprise an N-type semiconductor layer on the bottom and a P-type semiconductor layer on the top, thereby forming an N-P junction.

DETAILED DESCRIPTION OF THE EMBODIMENTS

Reference will now be made in detail to exemplary embodiments to provide a further understanding of the disclosure. The specific embodiments and the accompanying drawings discussed are merely illustrative of specific ways to make and use the disclosure, and do not limit the scope of the disclosure or the appended claims.

Figure 1A:
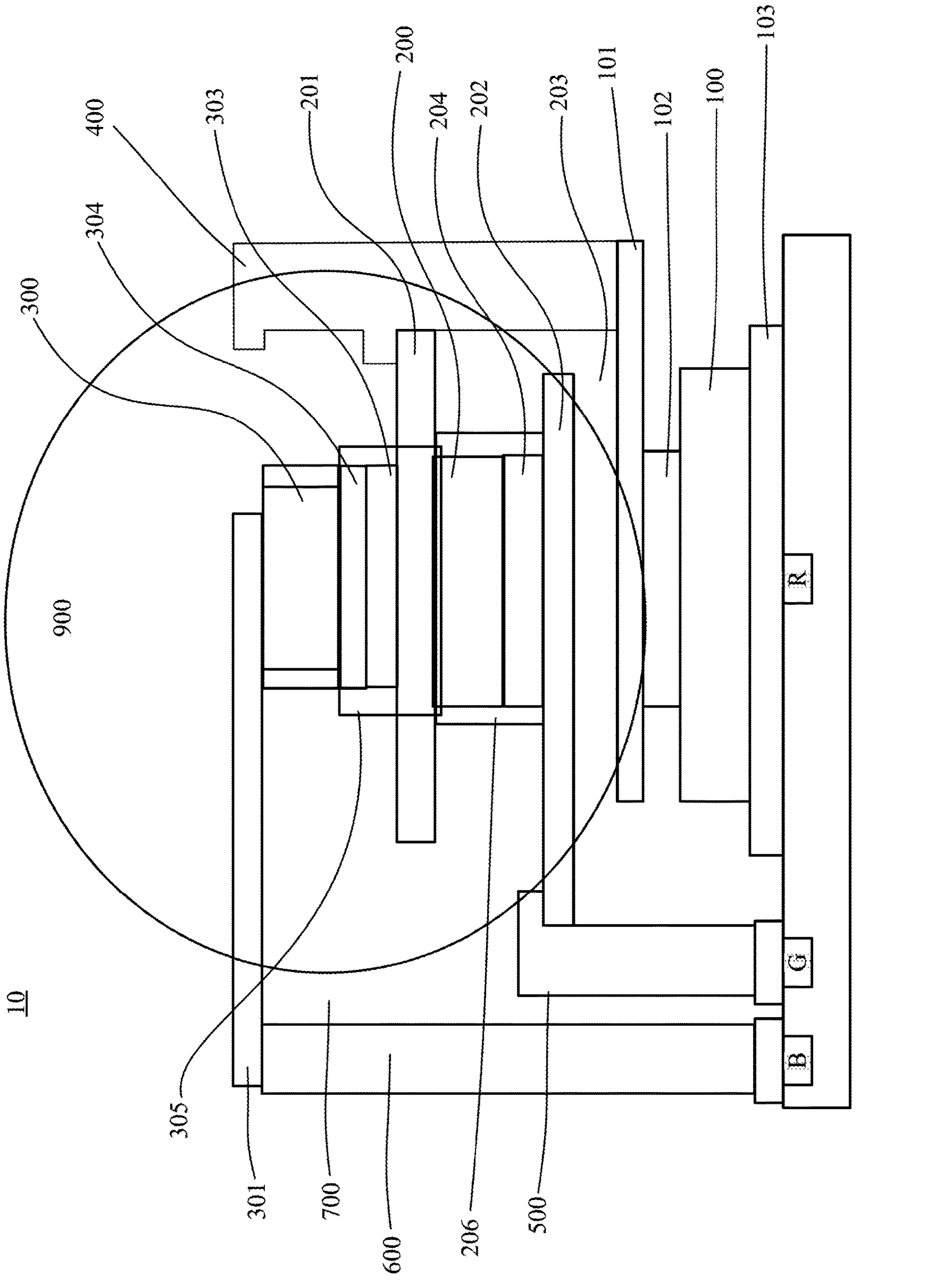
FIG. 1A is a cross sectional view of a micro LED structure, according to some embodiments of the present disclosure.

FIG. 1A is a cross-sectional view of a micro LED structure 10, according to some embodiments of the present disclosure. As shown in FIG. 1A, the micro LED structure 10 comprises an IC back plane 900 and three mesa structures stacked along a vertical axis. Specifically, among the three mesa structures, a first mesa structure comprises, from bottom up, a conductive bonding layer 103, a light emitting layer 100 (e.g., layer emitting light in red color), an N-contact 102, and a top connecting layer 101. As shown in FIG. 1C, N-contact 102 refers to a dot-shaped contact pad in plan view. N-contact 102 is formed on a surface of an N-type semiconductor epitaxial layer (i.e., "N-type epilayer"). N-contact 102 comprises a conductive material, such as metal, and forms an ohmic contact on the N-type epilayer. Referring back to FIG. 1A, the top connecting layer 101 is electrically connected to the top of the light emitting layer 100 via the N-contact 102, and the conductive bonding layer 103 bonds the bottom of the light emitting layer 100 to the IC back plane 900. A second mesa structure of the micro LED structure 10 comprises, from bottom up, a bottom connecting layer 202, a reflection layer 204, a light emitting layer 200 (e.g., layer emitting light in green color), and an interconnecting layer 201. In some embodiments, the first and second mesa structures, e.g., the top connecting layer 101 and the bottom connecting layer 202, may be bonded by a dielectric (i.e., electrically insulative) bonding layer 203. The interconnecting layer 201 is electrically connected to the top of the light emitting layer 200, and the bottom connecting layer 202 electrically connects the bottom of the reflection layer 204 to the IC back plane 900. A third mesa structure of the micro LED structure 10 comprises, from bottom up, a dielectric (i.e., electrically insulative) bonding layer 303, a reflection layer 304, a light emitting layer 300 (e.g., layer emitting light in blue color), and a top connecting layer 301. The dielectric bonding layer 303 bonds the reflection layer 304 and the interconnecting layer 201. The three mesa structures are stacked on the IC back plane 900, with the second mesa structure being formed above the first mesa structure, and the third mesa structure being formed above the second mesa structure.

In some embodiments, sidewall connecting structure 305 is formed on the interconnecting layer 201, and may surround the sidewalls of the reflection layer 304 and the dielectric bonding layer 303. The sidewall connecting structure 305 may provide electrical contact to the reflection layer 304 from its sides.

In some embodiments, insulation layer 206 (e.g., ALD, SiN, or $SiO_2$) may be deposited around the sidewalls of the mesa structures. In some embodiments, the ALD layer 206 may be deposited around the sidewalls of the light emitting layers 200 and the reflection layer 204. In some embodiments, the ALD layer may comprise $Al_2O_3$. The insulation layer 206 may provide sidewall passivation in order to minimize edge effects and losses through non-radiative recombination.

Continuing referring to FIG. 1A, in some embodiments, dielectric material 700 may be filled around the mesa structures. In some embodiments, the dielectric material 700 may be filled in gaps of the micro LED structure 10, thereby isolating the light emitting layers (e.g., the light emitting layers 100, 200, 300) from being electrically connected with each other.

In some embodiments, the light emitting layers 100, 200, 300 may emit light or light images in different colors. In some exemplary embodiments, the light emitting layer 100 is chosen as a red color light emitting layer, the light emitting layer 200 is chosen as a green color light emitting layer, and the light emitting layer 300 is chosen as a blue color light emitting layer. The above color assignment is for illustrative purpose only. Consistent with the disclosed embodiments, other combinations of light colors may be assigned to the light emitting layers to obtain any needed result.

In some embodiments, each of the light emitting layers 100, 200, 300 may comprise two semiconductor layers of different conductive types (e.g., P-type and N-type), and a quantum well layer between the two different type semiconductor layers. In some embodiments, the light emitting layers 100 and 200 may each have a P-type semiconductor layer at the bottom and an N-type semiconductor layer at the top, and the light emitting layer 300 may have an N-type semiconductor layer at the bottom and a P-type semiconductor layer at the top. In some other embodiments, the light emitting layers 100 and 200 each may have an N-type semiconductor layer at the bottom and a P-type semiconductor layer at the top, and the light emitting layer 300 may have a P-type semiconductor layer at the bottom and an N-type semiconductor layer at the top.

Figure 2A:
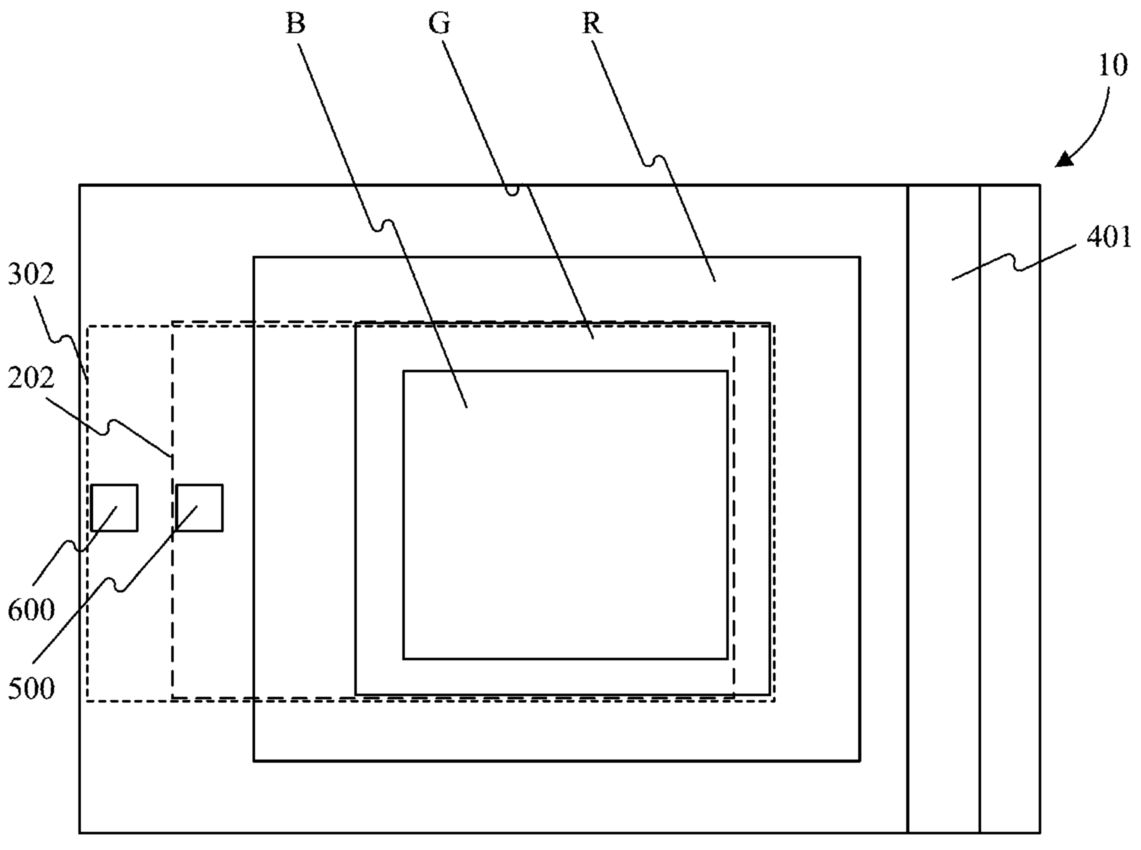
FIG. 2A is a top view of an exemplary micro LED structure, according to some embodiments of the present disclosure.

When vertically projecting the mesa structures of the micro LED structure 10 onto a horizontal plane, each of the mesa structure forms a projective area on the horizontal plane. Each projective area on the horizontal planes has an outline, which is herein referred to as projective outline in plan view (i.e., top view). In some embodiments, the disclosed micro LED structure is configured to make an upper light emitting layer's projective outline in plan view located within a lower light emitting layer's projective shape in plan view, thereby forming multiple mesa structures with different widths. Specifically, FIG. 2A is a top view of the micro LED structure 10 of FIG. 1A. As shown in FIG. 2A, R, G, B respectively represent the areas of the light emitting layers 100, 200, 300 formed in top view. In this exemplary embodiment, the projective outline of the light emitting layer 300 is located within the projective outline of the light emitting layer 200; and the projective outline of the light emitting layer 200 is located within the outline of the light emitting layer 100.

In some embodiments, the conductive bonding layer 103 may be transparent or opaque. In some embodiments, the material of the conductive bonding layer 103 is selected from one of a metal, a composite metal, or a transparent conductive material. In some embodiments, the transparent conductive material may be made of transparent plastic (resin) or silicon dioxide ($SiO_2$), e.g., spin-on glass (SOG), bonding adhesive Micro Resist BCL-1200, etc. The metal may be selected from copper (Cu), gold (Au), etc. In some embodiments, the thickness of the conductive bonding layer 103 can range from about 0.1 micron to about 5 microns. In some embodiments, metal compositions for the bonding layers may include Au—Au bonding, Au—Sn bonding, Au—In bonding, Ti—Ti bonding, Cu—Cu bonding, or a combination thereof. For example, when Au—Au bonding is needed, the two layers of Au each need a chrome (Cr) coating as an adhesive layer, and platinum (Pt) coating between the gold layer and the chrome coating as an anti-diffusion layer. The Cr and Pt layers may be formed on both Au layers to be bonded. In some embodiments, when the thicknesses of the two Au layers to be bonded are about the same, the mutual diffusion of Au on both Au layers may bond the two layers together under high pressure and high temperature. Example bonding techniques may include eutectic bonding, thermal compression bonding, and transient liquid phase (TLP).

In some embodiments, the dielectric bonding layers (e.g., 203, 303) may be $SiO_2$—$SiO_2$ bonding. The $SiO_2$—$SiO_2$ bonding may further reduce the thickness of the bonding layers while achieving a higher bond strength.

In some embodiments, the material of the connecting layers (e.g., 101, 201, 202, 301) may be selected from a transparent conductive material. In some embodiments, the transparent conductive material may be Indium Tin Oxide (ITO). In some embodiments, the thickness of the ITO layer can range from about 0.01 micron to about 1 micron.

In some embodiments, the second and third mesa structures are bonded and thus form the dielectric bonding layer 303. In some embodiments, the light emitting layer 200 may have its entire area covered by the connecting layer 201 and therefore have its entire area utilized.

In some embodiments, a cathode connecting layer through via 400 filled with conductive metal may be formed next to the light emitting layers 100,200,300, and next to the stack of mesa structures. In some exemplary embodiments, as shown in FIG. 1A, the cathode connecting layer through via 400 is electrically connected to the light emitting layers 100, 200, 300 via the connecting layer 101 or the interconnecting layer 201. In some embodiments, a top contact pad 401 may be formed on the top of the cathode connecting layer through via 400. The top contact pad 401 can be electrically connected to circuitry outside the micro LED structure 10.

In some embodiments, at least one of anode connecting layer through vias (e.g., 500, 600) may be formed next to the stacked mesa structures of micro LED structure 10. The anode connecting layer through vias 500, 600 are formed at positions that are separate from the position of the cathode connecting layer through via 400. For example, the anode connecting layer through vias 500, 600 may be positioned on a different side of the mesa structures from the cathode connecting layer through via 400. The through vias 400, 500, 600 are not electrically connected to each other.

In one exemplary embodiment, as shown in FIG. 1A, the anode connecting layer through via 500 connects the light emitting layer 200 to the IC back plane 900, via the bottom connecting layer 202. And the anode connecting layer through via 600 connects the light emitting layer 300 to the IC back plane 900, via the top connecting layer 301. In this exemplary embodiment, the light emitting layer 100 is electrically connected to the IC back plane 900 via the conductive bonding layer 103, and therefore no connecting layer through via is needed to connect the light emitting layer 100 to the IC back plane 900.

In some embodiments, the reflection layer 204 may be sandwiched between the bottom connecting layer 202 and the light emitting layer 200; the reflection layer 304 may be sandwiched between the dielectric bonding layer 303 and the light emitting layer 300. The sidewalls of the reflection layers 204, 304 are aligned with the sidewalls of the light emitting layer 200 and the dielectric bonding layer 303 in the mesa structures, respectively. For example, in the middle mesa structure, the reflection layer 204 is formed at the bottom surface of the light emitting layer 200 and the sidewall of the light emitting layer 200 is aligned with the sidewall of the reflection layer 204; and in the top mesa structure, the reflection layer 304 is formed at the bottom surface of the light emitting layer 300 and sidewall of the dielectric bonding layer 303 is aligned with the sidewall of the reflection layer 304. In some embodiments, each of the reflection layers in the micro LED structure 10 comprises stacked metal ODR layers or high-reflectivity metal.

In some exemplary embodiments, the light emitting layer 100 in the micro LED structure 10 (FIG. 1A) is designed to emit red light. Examples of a red light emitting layer include III-V nitride, III-V arsenide, III-V phosphide, and III-V antimonide epitaxial structures. In some embodiments, films within the red light emitting layer may include layers of P-type (Al)(In)(Ga)P, (Al) INGaP light emitting layer, N-type (Al)(In)(Ga)P, or N-type GaAs. In some embodiments, P-type may be Mg-doped or C-doped, and N-type may be Si-doped. In some embodiments, the thickness of the light emitting layer 100 may range from about 0.3 micron to about 5 microns.

In some embodiments, the light emitting layer 200 in the micro LED structure 10 (FIG. 1A) is designed to emit green light. Examples of a green light emitting layer include III-V nitride, III-V arsenide, III-V phosphide, and III-V antimonide epitaxial structures. In some embodiments, films within the green light emitting layer 200 may include the layers of P-type GaN/InGaN light-emitting layer/N-type GaN. In some embodiments, P-type may be Mg-doped, and N-type may be Si-doped. In some embodiments, the thickness of the light emitting layer 200 may range from about 0.3 micron to about 5 microns.

In some embodiments, the light emitting layer 300 in the micro LED structure 10 (FIG. 1A) is designed to emit blue light. Examples of a blue light emitting layer include III-V nitride, III-V arsenide, III-V phosphide, and III-V antimonide epitaxial structures. In some embodiments, films within the blue light emitting layer 300 may include the layers of P-type GaN, InGaN light-emitting layer, or N-type GaN. In some embodiments, P-type may be Mg-doped, and N-type may be Si-doped. In some embodiments, the thickness of the blue light emitting layer 300 may range from about 0.3 micron to about 5 microns.

In some embodiments, in the micro LED structure 10 (FIG. 1A) the connecting layer on the very top of the micro-LED structure (e.g., the top connecting layer 301) is deposited on the light emitting layer 300. In some embodiments, the thickness of the top connecting layer 301 (ITO layer) may be from about 0.01 micron to about 1 micron.

In some embodiments, a micro lens 800 may be formed on top of a micro LED structure (e.g., the micro LED structures as shown in FIG. 1A).

Figure 1B:
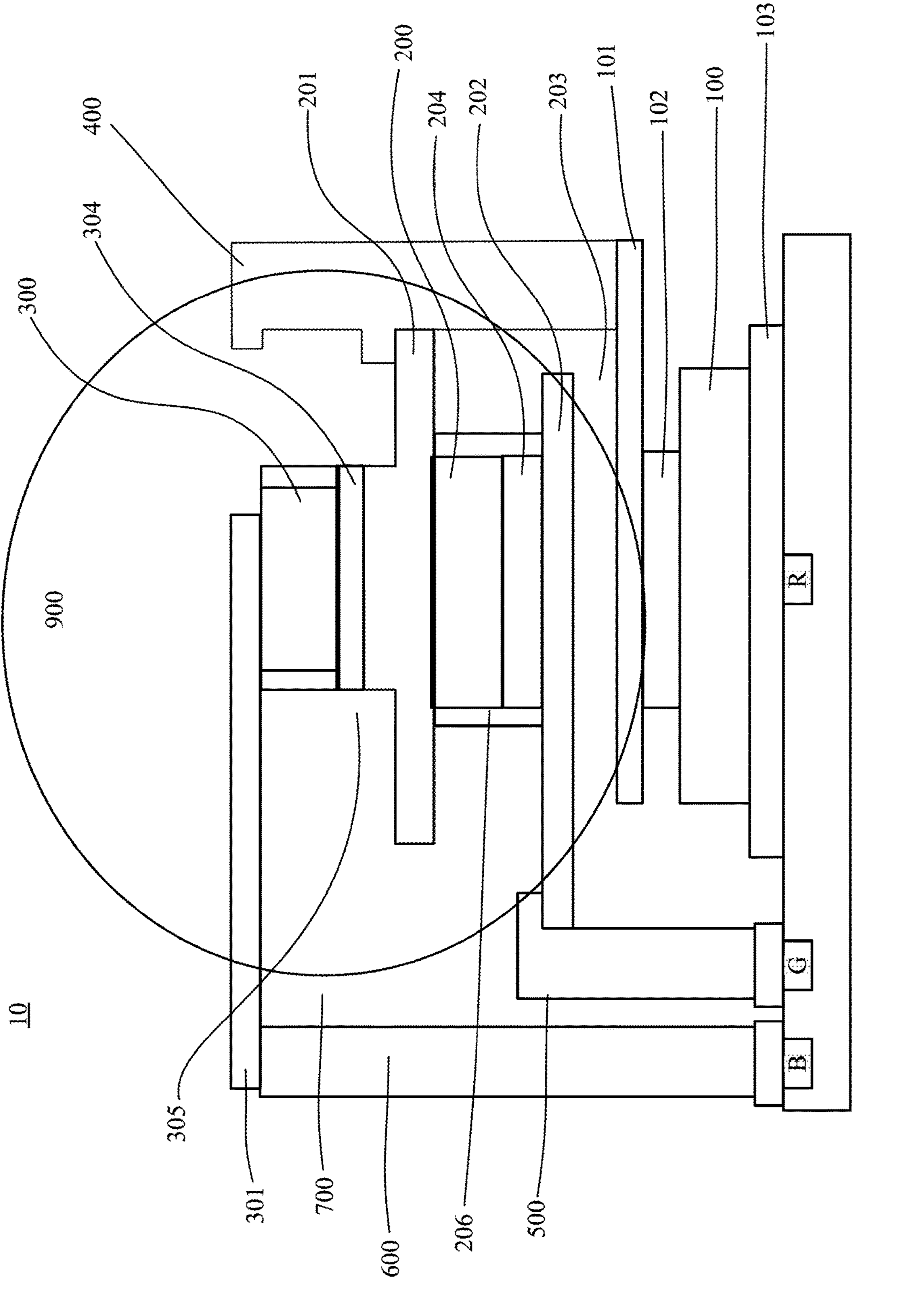
FIG. 1B is a cross sectional view of another micro LED structure, according to some embodiments of the present disclosure.
Figure 1C:
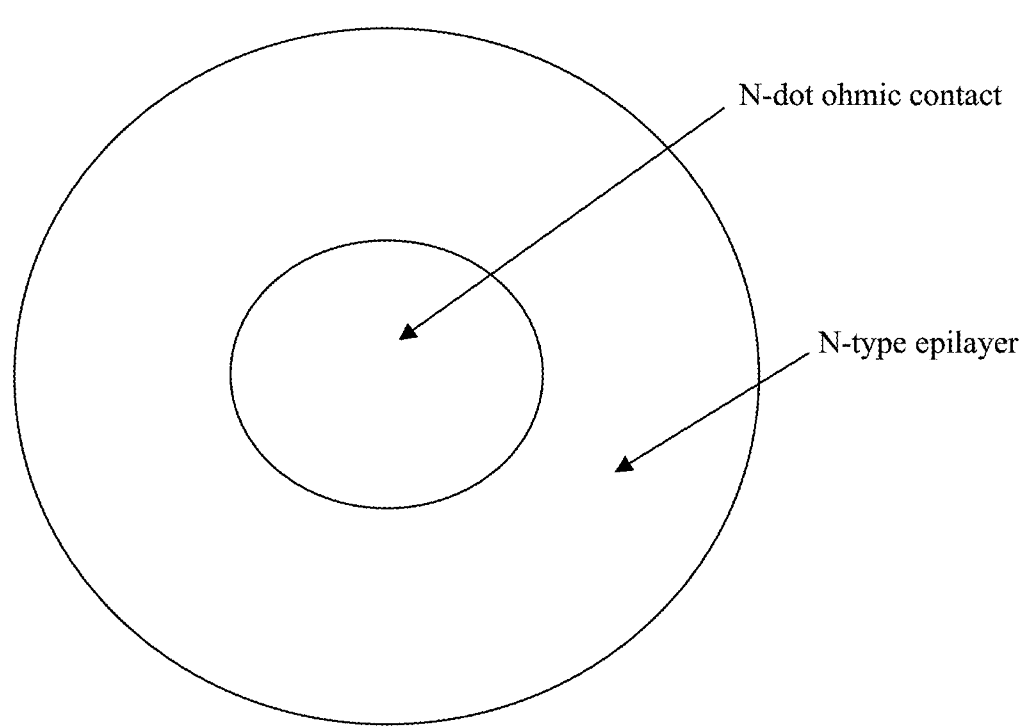
FIG. 1C is a top view illustration of an N-contact, according to some embodiments of the present disclosure.

FIG. 1B is a cross sectional view of a micro LED structure 20, according to some exemplary embodiments. The micro LED structure 20 is a variation of the micro LED structure 10 (FIG. 1A). The same numbers in FIGS. 1A and 1B refer to the same structures, the details of which are not repeated herein. Only the differences between FIGS. 1A and 1B are explained below. As shown in FIG. 1B, instead of using a transparent and electrically insulative material (e.g., $SiO_2$—$SiO_2$) (FIG. 1A), bonding layer 303 (as in FIG. 1A) can be made of a transparent and electrically conductive bonding layer, for example, an ITO-ITO bonding layer. The bottom connecting layer 201 is bonded directly to the bottom of the reflection layer 304.

Figure 2B:
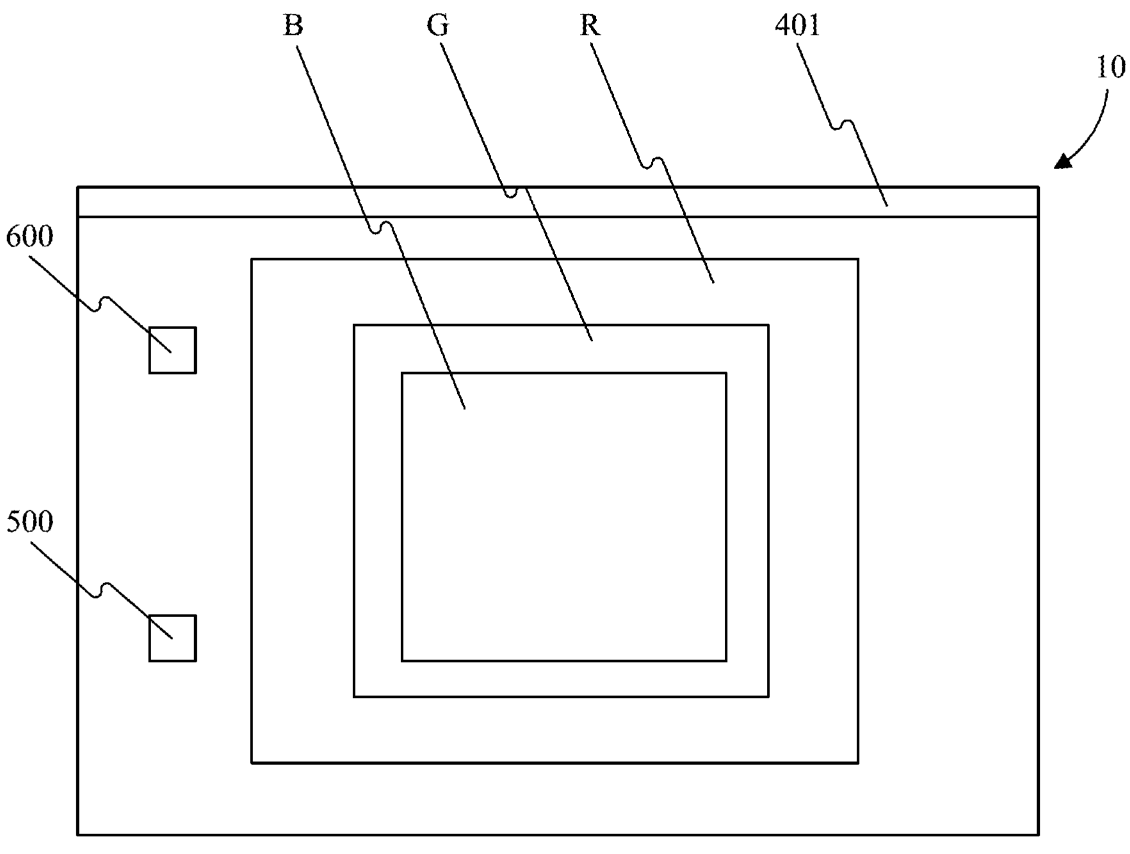
FIG. 2B is a top view of another exemplary micro LED structure, according to some embodiments of the present disclosure.

FIG. 2B schematically illustrates a top view of the micro LED structure 10 of FIG. 1B, according to another exemplary embodiment. As shown in FIG. 2B, The anode connecting layer through vias 500, 600 are formed in a direction parallel to adjacent edges of the mesa structures. The embodiments in FIGS. 2A and 2B are for illustrative purpose only. The common connecting layer through vias and the anode connecting layer through vias may be formed at any position in a micro LED area.

Figure 3:
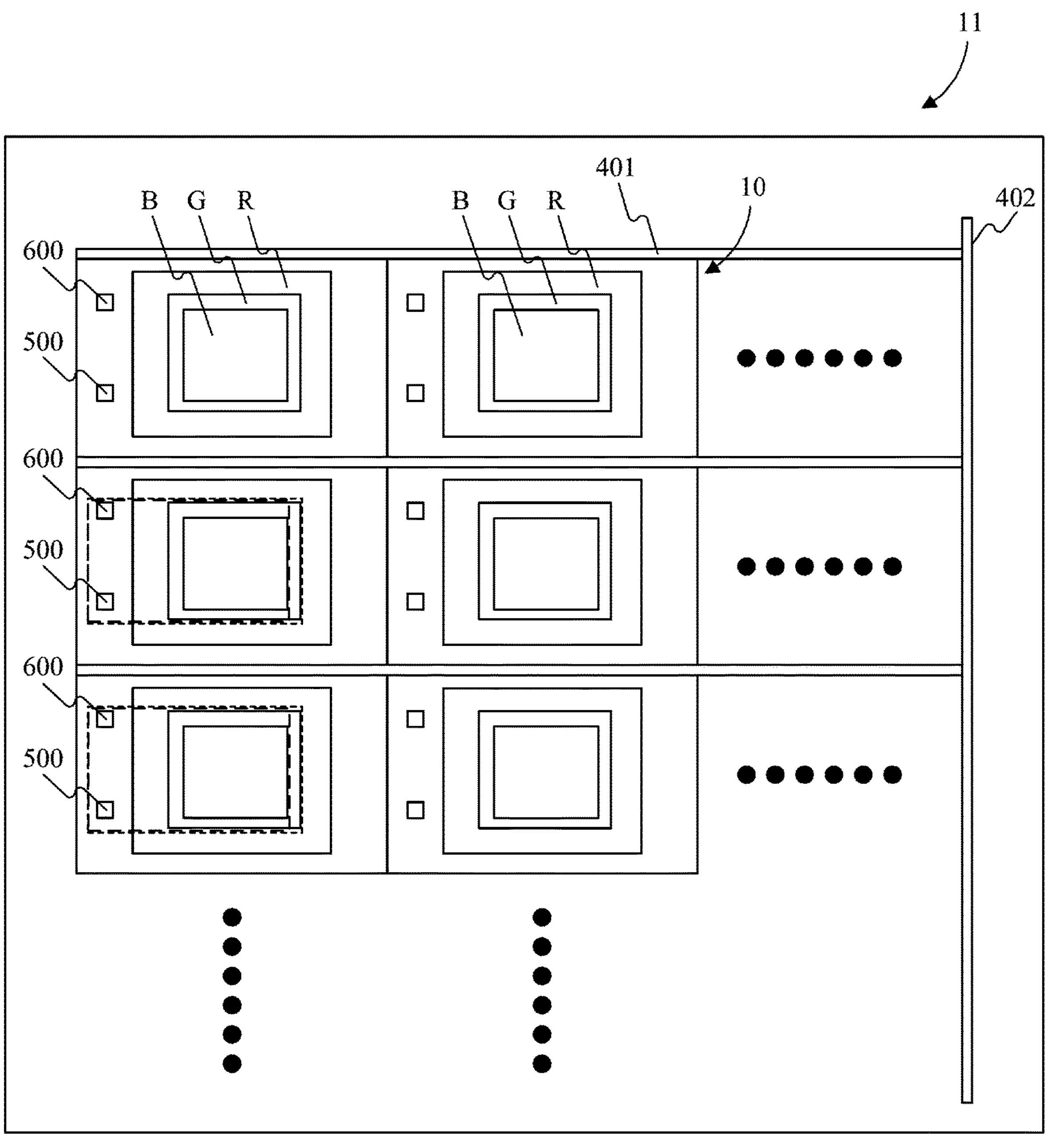
FIG. 3 is a top view of an exemplary micro LED panel, according to some embodiments of the present disclosure.

FIG. 3 is a top view of a micro LED panel 11, according to an exemplary embodiment. As shown in FIG. 3, the micro LED panel 11 includes an array of micro LED structures 10. As shown in FIG. 3, the top contact pads 401 of the multiple micro LED structures 10 in each row are connected together to form a continuous line. A shared contact pad 402 connects all the rows of the top contact pads 401 together. In this exemplary embodiment, the distributed direction of the anode connecting layer through vias 500, 600 is perpendicular to the distributed direction of the top contact pad 401.

Figure 4:
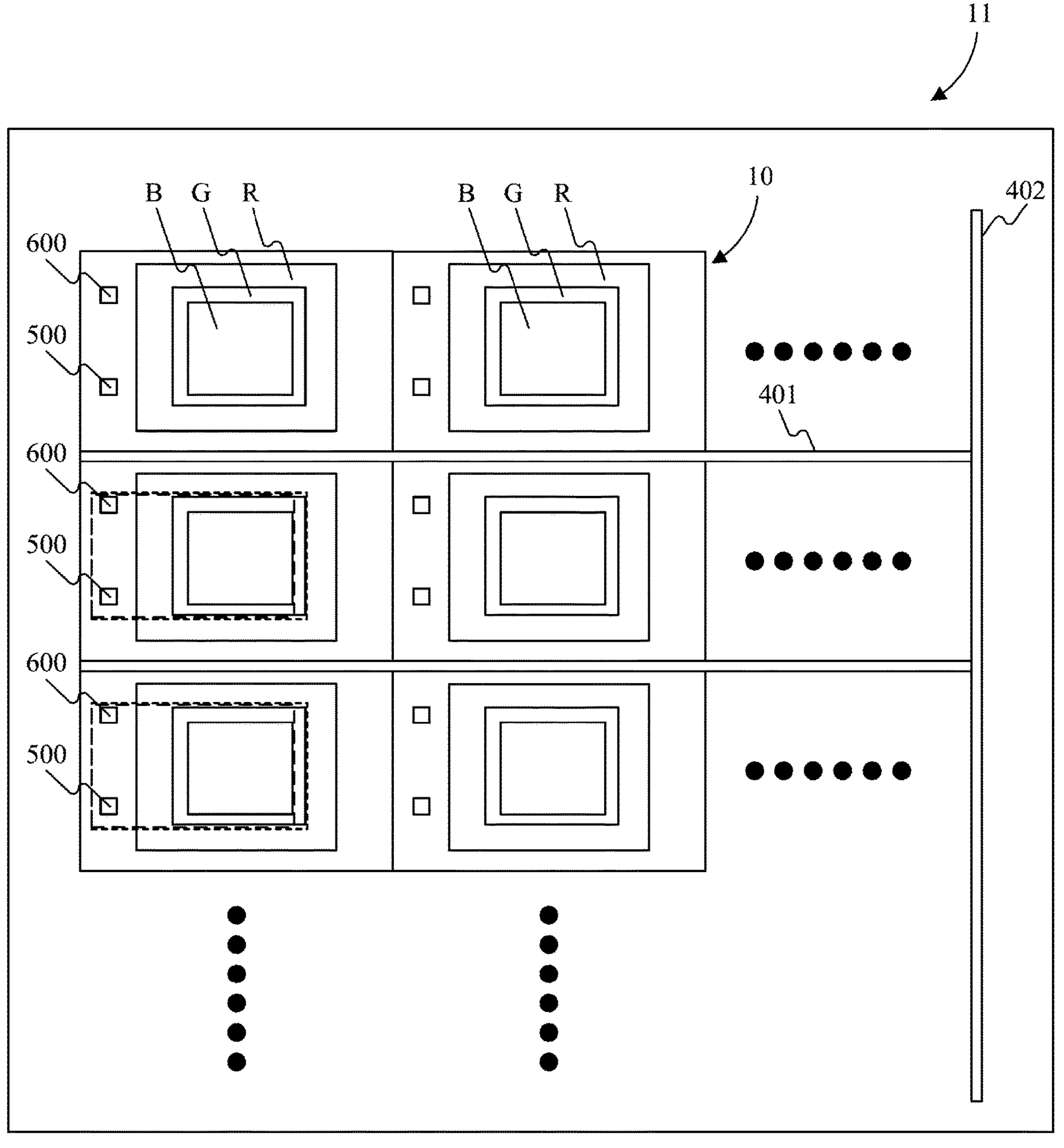
FIG. 4 is a top view of another exemplary micro LED panel, according to some embodiments of the present disclosure.

FIG. 4 is a top view of a micro LED panel 11, according to another exemplary embodiment. As shown in FIG. 4, the adjacent rows of micro LEDs share one top contact pad 401. This arrangement further increases the integration level of the micro LED panel.

The micro LEDs described in the disclosed embodiments have a very small size in volume. The micro LED may be an organic LED or an inorganic LED. In some embodiments, the micro LED may be applied in a micro LED array panel. The light emitting area of the micro LED array panel may be very small, e.g., 1 mm×1 mm, 3 mm×5 mm, etc. In some embodiments, the light emitting area may be the area of the micro LED array in the micro LED array panel. The micro LED array panel may include one or more micro LED arrays, which form a pixel array in which the micro LEDs are pixels, e.g., a 1600×1200, 680×480, or 1920×1080 pixel array. The diameter of the micro LED may be in the range of about 200 nm~2 μm. In some embodiments, an IC backplane may be formed at the back surface of the micro LED array and electrically connected to the micro LED array. In some embodiments, the IC backplane may acquire signals, such as, for example, image data from outside via signal lines, to control the on/off of the corresponding micro LEDs (e.g., emitting light or not).

Accordingly, different types of display panels may be fabricated. For example, in some embodiments, the resolution of a display panel may range from 8×8 to 3840×2160. Common display resolutions include QVGA with 320×240 resolution and an aspect ratio of 4:3, XGA with 1024×768 resolution and an aspect ratio of 4:3, D with 1280×720 resolution and an aspect ratio of 16:9, FHD with 1920×1080 resolution and an aspect ratio of 16:9, UHD with 3840×2160 resolution and an aspect ratio of 16:9, and 4K with 4096×2160 resolution and an aspect ratio of 1.9. There can also be a wide variety of pixel sizes, ranging from sub-micron and below to 10 mm and above. The size of the overall display region can also vary widely, ranging from diagonals as small as tens of microns or less up to hundreds of inches or more.

It is understood by those skilled in the art that, the micro LED display panel is not limited by the structure mentioned above, and may include more or less components than those as illustrated, or some components may be combined, or a different component may be utilized.

It should be noted that, the relational terms herein such as "first" and "second" are used only to differentiate an entity or operation from another entity or operation, and do not require or imply any actual relationship or sequence between these entities or operations. Moreover, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items.

As used herein, unless specifically stated otherwise, the term "or" encompasses all possible combinations, except where infeasible. For example, if it is stated that a database may include A or B, then, unless specifically stated otherwise or infeasible, the database may include A, or B, or A and B. As a second example, if it is stated that a database may include A, B, or C, then, unless specifically stated otherwise or infeasible, the database may include A, or B, or C, or A and B, or A and C, or B and C, or A and B and C.

It is understood by those skilled in the art that, all or part of the steps for implementing the foregoing embodiments may be implemented by hardware or may be implemented by a program that instructs related hardware. The program may be stored in the aforementioned flash memory, in the aforementioned conventional computer device, in the aforementioned central processing module, in the aforementioned adjustment module, etc.

The above descriptions are merely embodiments of the present disclosure, and the present disclosure is not limited thereto. A modifications, equivalent substitutions and improvements made without departing from the conception and principle of the present disclosure shall fall within the protection scope of the present disclosure.

The invention claimed is:

1. A micro LED structure, comprising:

an IC back plane;

at least three mesa structures stacked along a vertical axis, the at least three mesa structures comprising:

a first mesa structure formed on the IC back plane;

a second mesa structure formed on the first mesa structure; and a third mesa structure formed on the second mesa structure; and a top contact formed above the at least three mesa structures;

wherein the second mesa structure comprises:

a first connecting layer;

a first reflection layer formed on the first connecting layer;

a first light emitting layer formed on the first reflection layer, the first light emitting layer comprising a first semiconductor layer and a second semiconductor layer formed on the first semiconductor layer; and a second connecting layer formed on the first light emitting layer;

wherein the third mesa structure comprises:

a first bonding layer formed on the second connecting layer;

a second reflection layer formed on the first bonding layer;

a second light emitting layer formed on the second reflection layer, the second light emitting layer comprising a third semiconductor layer and a fourth semiconductor layer formed on the third semiconductor layer; and a third connecting layer formed on the second light emitting layer;

wherein the first connecting layer and the third connecting layer are electrically connected with the IC back plane;

wherein the second connecting layer is connected with the top contact; and wherein the first and fourth semiconductor layers have a first conductive type, and the second and third semiconductor layers have a second conductive type.

2. The micro LED structure of claim 1, wherein the first bonding layer comprises a transparent and electrically insulative material.

3. The micro LED structure of claim 2, wherein the transparent and electrically insulative material is silicon dioxide ($SiO_2$).

4. The micro LED structure of claim 1, wherein the first bonding layer comprises a transparent and electrically conductive material.

5. The micro LED structure of claim 4, wherein the transparent and electrically conductive material is indium tin oxide (ITO).

6. The micro LED structure of claim 1, wherein the first, second, and third mesa structures respectively form a first outline, a second outline, and a third outline in plan view, the third outline being disposed within the second outline, the second outline being disposed within the first outline.

7. The micro LED structure of claim 1, wherein the first mesa structure comprises:

a second bonding layer formed on and electrically connected to the IC back plane;

a third light emitting layer formed on the second bonding layer, the third light emitting layer comprising a fifth semiconductor layer and a sixth semiconductor layer formed on the fifth semiconductor layer, the fifth semiconductor layer having the first conductive type, and the sixth semiconductor layer having the second conductive type; and a fourth connecting layer formed on the third light emitting layer and electrically connected to the top contact; and wherein the micro LED structure further comprises a third bonding layer formed between the first connecting layer and fourth connecting layer.

8. The micro LED structure of claim 7, further comprising a first through via formed next to one or more of the first, second, and third mesa structures, the first through via being electrically connected to the second connecting layer and the fourth connecting layer.

9. The micro LED structure of claim 8, further comprising a second through via and a third through via formed next to one or more of the first, second, and third mesa structures, wherein the second through via connects the first connecting layer to the IC back plane and the third through via connects the third connecting layer to the IC back plane.

10. The micro LED structure of claim 7, wherein the third bonding layer comprises a transparent and electrically insulative material.

11. The micro LED structure of claim 10, wherein the third bonding layer comprises silicon dioxide ($SiO_2$).

12. The micro LED structure of claim 1, wherein each of the first, second, and third connecting layers comprises a transparent and electrically conductive material.

13. The micro LED structure of claim 12, wherein the transparent and electrically conductive material is indium tin oxide (ITO).

14. The micro LED structure of claim 1, wherein a sidewall of the second reflection layer is aligned with a sidewall of the first bonding layer.

15. The micro LED structure of claim 1, wherein the first and second reflection layers each comprise:

stacked transparent layers;

metal omnidirectional reflection (ODR) layers; or high-reflectivity metal.

16. The micro LED structure of claim 1, wherein each of the first and second reflection layers is electrically conducting.

17. The micro LED structure of claim 1, wherein the first and second conductive types are P type and N type, respectively; or the first and second conductive types are N type and P type, respectively.

18. The micro LED structure of claim 1, further comprising a sidewall connecting structure, wherein:

the sidewall connecting structure is formed on the second connecting layer and surrounds sidewalls of the first bonding layer and the second reflection layer.

19. The micro LED structure of claim 18, wherein the sidewall connecting structure comprises a transparent and electrically conductive material.

20. The micro LED structure of claim 19, wherein the transparent and electrically conductive material is indium tin oxide (ITO).

21. A full color micro LED panel comprising a micro LED array, the micro LED array comprises a plurality of micro LED structures, wherein each of the plurality of micro LED structures comprises:

an IC back plane;

at least three mesa structures stacked along a vertical axis, the at least three mesa structures comprising:

a first mesa structure formed on the IC back plane;

a second mesa structure formed on the first mesa structure; and a third mesa structure formed on the second mesa structure; and a top contact formed above the at least three mesa structures;

wherein the second mesa structure comprises:

a first connecting layer;

a first reflection layer formed on the first connecting layer;

a first light emitting layer formed on the first reflection layer, the first light emitting layer comprising a first semiconductor layer and a second semiconductor layer formed on the first semiconductor layer; and a second connecting layer formed on the first light emitting layer;

wherein the third mesa structure comprises:

a first bonding layer formed on the second connecting layer;

a second reflection layer formed on the first bonding layer;

a second light emitting layer formed on the second reflection layer, the second light emitting layer comprising a third semiconductor layer and a fourth semiconductor layer formed on the third semiconductor layer; and a third connecting layer formed on the second light emitting layer;

wherein the first connecting layer and the third connecting layer are electrically connected with the IC back plane;

wherein the second connecting layer is connected with the top contact; and wherein the first and fourth semiconductor layers have a first conductive type, and the second and third semiconductor layers have a second conductive type.

22. The micro LED structure of claim 1, wherein the first light emitting layer emits green light.

23. The micro LED structure of claim 7, wherein the third light emitting layer emits red light.

24. The full color micro LED panel of claim 21, wherein the second light emitting layer emits green light.

* * * * *